United States Patent
Sugisawa et al.

(10) Patent No.: US 8,404,500 B2
(45) Date of Patent: Mar. 26, 2013

(54) METHOD FOR MANUFACTURING LIGHT-EMITTING ELEMENT, LIGHT-EMITTING ELEMENT, LIGHT-EMITTING DEVICE, LIGHTING DEVICE, AND ELECTRONIC APPLIANCE

(75) Inventors: Nozomu Sugisawa, Kanagawa (JP); Toshiki Sasaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 79 days.

(21) Appl. No.: 12/914,174

(22) Filed: Oct. 28, 2010

(65) Prior Publication Data
US 2011/0101379 A1 May 5, 2011

(30) Foreign Application Priority Data
Nov. 2, 2009 (JP) ................. 2009-252234

(51) Int. Cl.
*H01L 21/00* (2006.01)
(52) U.S. Cl. ............... 438/22; 257/79; 257/E33.001
(58) Field of Classification Search ............ 438/22; 257/79, E33.001
See application file for complete search history.

(56) References Cited

U.S. PATENT DOCUMENTS

| 5,404,075 | A | 4/1995 | Fujikawa et al. |
| 5,989,737 | A | 11/1999 | Xie et al. |
| 6,013,384 | A | 1/2000 | Kido et al. |
| 6,380,687 | B1 | 4/2002 | Yamazaki |
| 6,423,429 | B2 | 7/2002 | Kido et al. |
| 6,483,236 | B1 | 11/2002 | Hung |
| 6,486,601 | B1 | 11/2002 | Sakai et al. |
| 6,489,638 | B2 | 12/2002 | Seo et al. |
| 6,518,700 | B1 | 2/2003 | Friend et al. |
| 6,552,496 | B2 | 4/2003 | Yamazaki |
| 6,573,650 | B2 | 6/2003 | Aoki et al. |

(Continued)

FOREIGN PATENT DOCUMENTS

| EP | 0 855 848 A2 | 7/1998 |
| EP | 0 948 063 A2 | 10/1999 |

(Continued)

OTHER PUBLICATIONS

Nakada, T. et al., "27a-ZL-12 Multi Photon Emission Organic EL Devices Using Charge-Transfer Complex as Charge Generation Layer," 63rd Applied Physics-Related Combined Seminar—Seminar Proceedings, Sep. 24, 2002, p. 1165 (with English translation).

(Continued)

Primary Examiner — Long Pham
(74) Attorney, Agent, or Firm — Husch Blackwell LLP

(57) ABSTRACT

One object is to provide a light-emitting element which overcomes the problems of electrical characteristics and a light reflectivity have been solved. The light-emitting element is manufactured by forming a first electrode including aluminum and nickel over a substrate; by forming a layer including a composite material in which a metal oxide is contained in an organic compound so as to be in contact with the first electrode after heat treatment is performed with respect to the first electrode; by forming a light-emitting layer over the layer including a composite material; and by forming a second electrode which has a light-transmitting property over the light-emitting layer. Further, the first electrode is preferably formed to include the nickel equal to or greater than 0.1 atomic % and equal to or less than 4.0 atomic %.

8 Claims, 16 Drawing Sheets

U.S. PATENT DOCUMENTS

| | | | |
|---|---|---|---|
| 6,589,673 | B1 | 7/2003 | Kido et al. |
| 6,642,544 | B1 | 11/2003 | Hamada et al. |
| 6,650,047 | B2 | 11/2003 | Aoki et al. |
| 6,774,573 | B2 | 8/2004 | Yamazaki |
| 6,794,278 | B2 | 9/2004 | Kido et al. |
| 6,830,494 | B1 | 12/2004 | Yamazaki et al. |
| 6,993,214 | B2 | 1/2006 | Nishimura et al. |
| 7,074,500 | B2 | 7/2006 | Pfeiffer et al. |
| 7,321,196 | B2 | 1/2008 | Cheng et al. |
| 7,323,225 | B2 | 1/2008 | Aoki et al. |
| 7,374,828 | B2 | 5/2008 | Kondakova et al. |
| 8,049,206 | B2 | 11/2011 | Furukawa et al. |
| 8,128,727 | B2 * | 3/2012 | Nomura et al. ............ 75/416 |
| 2001/0004190 | A1 | 6/2001 | Nishi et al. |
| 2001/0025959 | A1 | 10/2001 | Yamazaki et al. |
| 2001/0041270 | A1 | 11/2001 | Maruyama et al. |
| 2001/0043046 | A1 | 11/2001 | Fukunaga |
| 2001/0046611 | A1 | 11/2001 | Kido et al. |
| 2001/0053559 | A1 | 12/2001 | Nagao et al. |
| 2002/0093290 | A1 | 7/2002 | Yamazaki |
| 2003/0111666 | A1 | 6/2003 | Nishi et al. |
| 2003/0171060 | A1 | 9/2003 | Hirano et al. |
| 2003/0189401 | A1 | 10/2003 | Kido et al. |
| 2003/0214246 | A1 | 11/2003 | Yamazaki |
| 2004/0140758 | A1 | 7/2004 | Raychaudhuri et al. |
| 2004/0160154 | A1 | 8/2004 | Nishimura et al. |
| 2005/0006667 | A1 | 1/2005 | Yamazaki |
| 2005/0035708 | A1 | 2/2005 | Yamazaki et al. |
| 2005/0084712 | A1 | 4/2005 | Kido et al. |
| 2005/0084713 | A1 | 4/2005 | Kido et al. |
| 2005/0098207 | A1 | 5/2005 | Matsumoto et al. |
| 2005/0106419 | A1 | 5/2005 | Endoh et al. |
| 2005/0170208 | A1 | 8/2005 | Yatsunami et al. |
| 2005/0248267 | A1 | 11/2005 | Gyoutoku et al. |
| 2006/0008740 | A1 | 1/2006 | Kido et al. |
| 2006/0163597 | A1 | 7/2006 | Noda et al. |
| 2006/0186804 | A1 | 8/2006 | Sakakura et al. |
| 2006/0202610 | A1 | 9/2006 | Karasawa et al. |
| 2006/0232203 | A1 | 10/2006 | Noda |
| 2007/0200125 | A1 | 8/2007 | Ikeda et al. |
| 2008/0088229 | A1 | 4/2008 | Egawa |
| 2009/0001373 | A1 | 1/2009 | Ochi et al. |
| 2009/0058267 | A1 | 3/2009 | Nakashima et al. |
| 2009/0085474 | A1 | 4/2009 | Shitagaki et al. |
| 2011/0008640 | A1 | 1/2011 | Goto et al. |

FOREIGN PATENT DOCUMENTS

| | | | |
|---|---|---|---|
| EP | 1 009 198 | A1 | 6/2000 |
| EP | 1 065 723 | A2 | 1/2001 |
| EP | 1 089 361 | A2 | 4/2001 |
| EP | 1 093 167 | A2 | 4/2001 |
| EP | 1 128 438 | A1 | 8/2001 |
| EP | 1 160 891 | A2 | 12/2001 |
| EP | 1 261 042 | A1 | 11/2002 |
| EP | 1 351 558 | A1 | 10/2003 |
| EP | 1 424 732 | A2 | 6/2004 |
| EP | 1 524 706 | A2 | 4/2005 |
| EP | 1 524 707 | A2 | 4/2005 |
| EP | 1 530 245 | A2 | 5/2005 |
| JP | 1-312873 | A | 12/1989 |
| JP | 2-139892 | A | 5/1990 |
| JP | 3-114197 | A | 5/1991 |
| JP | 3-190088 | A | 8/1991 |
| JP | 3-274695 | A | 12/1991 |
| JP | 4-357694 | A | 12/1992 |
| JP | 5-182766 | A | 7/1993 |
| JP | 6-267658 | A | 9/1994 |
| JP | 6-290873 | A | 10/1994 |
| JP | 7-312289 | A | 11/1995 |
| JP | 9-63771 | A | 3/1997 |
| JP | 10-255985 | A | 9/1998 |
| JP | 10-270171 | A | 10/1998 |
| JP | 10-308284 | A | 11/1998 |
| JP | 2824411 | | 11/1998 |
| JP | 11-251067 | A | 9/1999 |
| JP | 11-297474 | A | 10/1999 |
| JP | 11-307259 | A | 11/1999 |
| JP | 11-307264 | A | 11/1999 |
| JP | 2000-223276 | A | 8/2000 |
| JP | 2000-315580 | A | 11/2000 |
| JP | 2000-315581 | A | 11/2000 |
| JP | 2001-43980 | | 2/2001 |
| JP | 2001-76868 | A | 3/2001 |
| JP | 2001-185354 | A | 7/2001 |
| JP | 2001-244079 | A | 9/2001 |
| JP | 2002-15873 | A | 1/2002 |
| JP | 2002-332567 | A | 11/2002 |
| JP | 2002-367784 | A | 12/2002 |
| JP | 2003-229278 | A | 8/2003 |
| JP | 2003-272860 | A | 9/2003 |
| JP | 2004-134395 | A | 4/2004 |
| JP | 2004-514257 | A | 5/2004 |
| JP | 2004-178930 | A | 6/2004 |
| JP | 2004-349007 | A | 12/2004 |
| JP | 2005-26121 | A | 1/2005 |
| JP | 2005-32618 | A | 2/2005 |
| JP | 2005-123094 | A | 5/2005 |
| JP | 2005-123095 | A | 5/2005 |
| JP | 2005-166637 | A | 6/2005 |
| JP | 2005-251587 | A | 9/2005 |
| JP | 2009-33140 | | 2/2009 |
| JP | 2009-282504 | | 12/2009 |
| WO | WO 00/01203 | A1 | 1/2000 |
| WO | WO 02/41414 | A1 | 5/2002 |
| WO | WO 2005/006460 | A1 | 1/2005 |

OTHER PUBLICATIONS

Tokito, S. et al., "Metal Oxides as a Hole-Injecting Layer for an Organic Electroluminescent Device," Journal of Physics D: Applied Physics, 1996, vol. 29, No. 11, pp. 2750-2753.

* cited by examiner

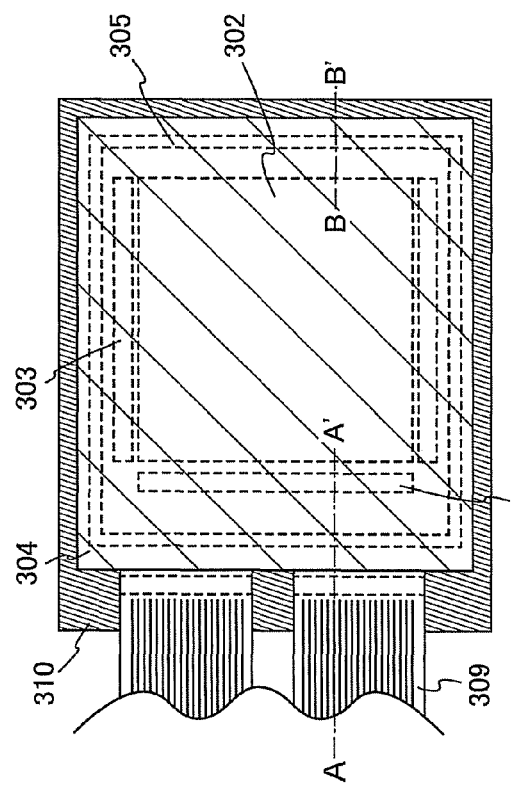
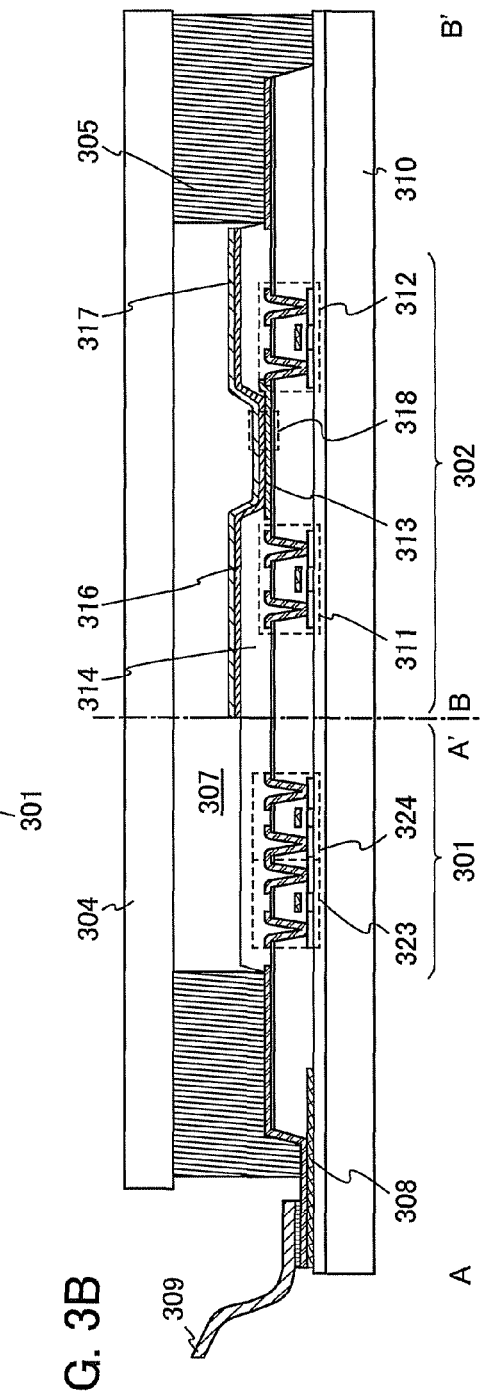
FIG. 3A
FIG. 3B

METHOD FOR MANUFACTURING LIGHT-EMITTING ELEMENT, LIGHT-EMITTING ELEMENT, LIGHT-EMITTING DEVICE, LIGHTING DEVICE, AND ELECTRONIC APPLIANCE

BACKGROUND OF THE INVENTION

1. Field of the Invention

One embodiment of the invention relates to a light-emitting element utilizing electroluminescence and a manufacturing method thereof. Further, one embodiment of the invention relates to a light-emitting device and a display device using the light-emitting element.

2. Description of the Related Art

In recent years, research and development have been extensively conducted on light-emitting elements using electroluminescence. In a basic structure of such a light-emitting element, a layer containing a substance having a light-emitting property is interposed between a pair of electrodes. By applying a voltage to this element, light emission can be obtained from the substance having a light-emitting property.

Since the above light-emitting element is a self-luminous type, a display device using this light-emitting element has advantages such as high visibility, no necessity of a backlight, and the like. Further, such a light-emitting element also has advantages in that the element can be formed to be thin and lightweight and that response time is high.

Further, since a light-emitting element can be formed by stacking thin films, a display device using this light-emitting element can have a large area. That is, a planar light source can be easily provided. The feature that a large area can be provided is difficult to realize with point light sources typified by a filament lamp and an LED or with linear light sources typified by a fluorescent light. Therefore, such light-emitting elements also have a high utility value.

The light-emitting elements using electroluminescence are roughly classified in accordance with whether they include an organic compound or an inorganic compound as a substance having a light-emitting property. When an organic compound is used as a substance having a light-emitting property, the emission mechanism is as follows.

First, a voltage is applied to a light-emitting element. This allows electrons and holes to be injected from a pair of electrodes into a layer including a light-emitting organic compound. Accordingly, the light-emitting organic compound is raised to an excited state. Then, recombining carriers (electrons and holes) emit light in transition from the excited state to the ground state.

Because of the above mechanism, such a light-emitting element is called a current-excitation light-emitting element. Note that an excited state of an organic compound can be of two types: a singlet excited state and a triplet excited state, and luminescence from the singlet excited state (S*) is referred to as fluorescence, and luminescence from the triplet excited state (T*) is referred to as phosphorescence. Furthermore, it is thought that the ratio of S* to T* in a light-emitting element is statistically 1:3.

A light-emitting element using an organic compound as a substance having a light-emitting property has a lot of problems which depend on materials or element structure. In order to improve the element characteristic, development of a novel material has been carried out and improvement in an element structure has been considered.

For example, in the case where the above light-emitting element is applied to an active matrix type display device, the light-emitting element is formed over an element substrate provided with a transistor that controls light emission and the like. However, there has been a problem of decrease in aperture ratio caused by a wiring, a transistor, or the like in a structure where light emitted from a light-emitting element is extracted to the outside through the element substrate provided with a transistor and the like (bottom emission structure).

In order to solve this problem, a structure where light is extracted from the side opposite to an element substrate (a top emission structure) is proposed (see Patent Document 1, for example). By using a top emission structure, the aperture ratio can be increased and the light quantity which is extracted can be increased.

REFERENCE

[Patent Document 1] Japanese Published Patent Application No. 2001-043980

SUMMARY OF THE INVENTION

When a top emission structure is applied, it is necessary for an electrode formed over a substrate to have a function of reflecting light.

Further, when the electrode is used as an anode, a material with a high work function is preferably used in terms of electrical characteristics. At this point, in the above-mentioned Patent Document 1, the method in which a material selected from chromium, molybdenum, tungsten, and niobium is included in a portion of an anode which is in contact with an organic layer is applied. However, since these materials are relatively expensive, when the electrode is formed using these materials, there arises a problem that manufacturing cost increases.

Further, these materials lack sufficient properties in a light reflectivity. Thus, when an electrode using any of these materials is formed, there arises a problem that light extraction efficiency decreases.

In view of the above problems, an object of one embodiment of the invention disclosed in this specification and the like is to provide a light-emitting element which overcomes the problems of electrical characteristics and a light reflectivity have been solved. Further, another object is to provide a light-emitting device, a lighting device or the like using such a light-emitting element.

According to one embodiment of the invention disclosed in this specification and the like, an electrode including aluminum and nickel is formed and in contact with a layer including a composite material in which a metal oxide is contained in an organic compound, whereby a hole-injection property and a light reflectivity can be kept at high level. Details thereof are described below.

One embodiment of the present invention disclosed is a method for manufacturing a light-emitting element, including the steps of forming a first electrode including aluminum and nickel over a substrate; forming a layer including a composite material in which a metal oxide is contained in an organic compound so as to be in contact with the first electrode after heat treatment is performed with respect to the first electrode; forming a light-emitting layer over the layer including a composite material; and a second electrode which has a light-transmitting property over the light-emitting layer.

In the above, etching treatment is preferably performed with respect to the first electrode, in addition to the heat treatment. Further, the first electrode is preferably formed to include the nickel equal to or greater than 0.1 atomic % and equal to or less than 4.0 atomic %. Furthermore, an optically resonant structure is preferably provided by adjusting the light path length between the first electrode and the second electrode to be an integral multiple of the wavelength of light emitted from a light-emitting layer.

Moreover, in the above, a layer including a substance having a high hole-injection property or a substance having a high hole-transport property is preferably formed between the layer including a composite material and the light-emitting layer. In addition, a layer including a substance having a high electron-injection property or a substance having a substance a high electron-transport property is preferably formed between the light-emitting layer and the second electrode.

Another embodiment of the invention disclosed is a light-emitting element including a first electrode including aluminum and nickel is formed over a substrate; a layer including a composite material in which a metal oxide is contained in an organic compound, which is contact with the first electrode; a light-emitting layer over the layer including a composite material; and a second electrode which has a light-transmitting property over the light-emitting layer.

In the above, in the first electrode, the nickel is preferably precipitated locally. Further, the first electrode is preferably formed to include the nickel equal to or greater than 0.1 atomic % and equal to or less than 4.0 atomic %. Furthermore, the first electrode has preferably a light reflectivity of equal to or greater than 80% and less than 100% in the visible light region (in the wavelength of equal to or greater than 400 nm and equal to or less than 800 nm). Moreover, an optically resonant structure is preferably provided with the first electrode and the second electrode.

In the above, a layer including a substance having a high hole-injection property or a substance having a high hole-transport property is formed between the layer including a composite material and the light-emitting layer. In addition, a layer including a substance having a high electron-injection property or a substance having a substance a high electron-transport property is formed between the light-emitting layer and the second electrode.

Furthermore, a light-emitting device (a lighting device) or a variety of electronic appliances using the above light-emitting element can be manufactured and provided.

Note that the term "light-emitting device" in this specification and the like includes an image display device, a light source, and the like. Moreover, the light-emitting device includes a module in which a connector (for example, FPC: Flexible Printed Circuit) is attached to a panel where a light-emitting element is formed.

According to one embodiment of the invention disclosed, an electrode is formed using a low cost material having an excellent reflecting property. As the layer which is in contact with the electrode, a layer which includes a composite material in which a metal oxide is contained in an organic compound is applied. This makes it possible to provide an inexpensive light-emitting element which has favorable characteristics.

That is, electrical characteristics (in particular, a hole-injection property) and a light reflectivity can be kept at high level, whereby sufficient light extraction efficiency can be achieved and power consumption is reduced. Further, since an inexpensive material is used, cost for manufacturing the light-emitting element can be reduced.

Furthermore, by using such a light-emitting element, power consumption of a light-emitting device (a lighting device) or a variety of electronic appliances is reduced and environmental load can be reduced.

BRIEF DESCRIPTION OF THE DRAWINGS

FIGS. 3A and 3B illustrate an example of a light-emitting device.

DETAILED DESCRIPTION OF THE INVENTION

Figure 1:
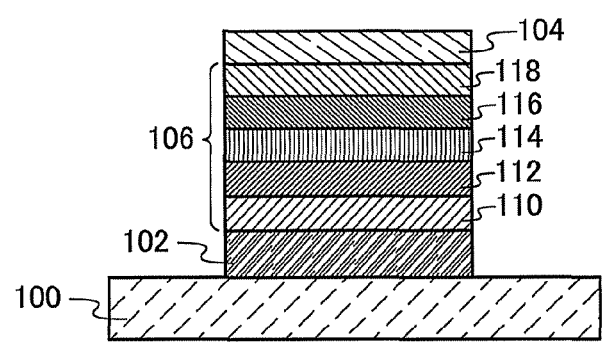
FIG. 1 illustrates an example of a light-emitting element.

Hereinafter, embodiments are described in detail using the drawings. Note that the present invention is not limited to the description in the embodiments and the example below, and it is apparent to those skilled in the art that modes and details can be modified in various ways without departing from the spirit and scope of the present invention. A structure of the different embodiment can be implemented by combination appropriately. Note that the same reference numerals refer to the same portions or portions having similar functions throughout the structure of the present invention described below, and the description thereof is not repeated.

Embodiment 1

In this embodiment, a light-emitting element which is one embodiment of the disclosed invention is described with reference to FIG. 1.
<Structure of Light-Emitting Element>

The light-emitting element shown in FIG. 1 includes a first electrode 102, a second electrode 104, and an electroluminescence layer (hereinafter referred to as an EL layer 106) which is interposed between the first electrode 102 and the second electrode 104. Here, the first electrode 102 may be used as an anode while the second electrode 104 is used as a cathode, or the first electrode 102 may be used as a cathode while the second electrode 104 is used as an anode. In this embodiment, the case where the first electrode 102 functions as an anode and the second electrode 104 functions as a cathode is described as an example.
<Substrate>

A substrate 100 functions as a supporting body of the light-emitting element. For the substrate 100, a glass substrate, a plastic substrate, a metal substrate, or the like can be used, for example. Note that materials other than glass, plastic, or metal can be used as long as they can function as a support of the light-emitting element.
<First Electrode>

A first electrode 102 is an electrode that functions as an anode and as a reflective electrode. Here, an alloy containing aluminum is preferably used as the first electrode 102. In particular, an alloy of aluminum and nickel (a conductive material including aluminum and nickel) is preferably used. Since an alloy of aluminum is excellent in reflecting property of light, light extraction efficiency can be kept at high level by using an alloy of aluminum for electrodes of the light-emitting element. Further, in order to keep electric characteristics and a reflecting property of light at high level, the first electrode 102 preferably includes the nickel equal to or greater than 0.1 atomic % and equal to or less than 4.0 atomic %. In that case, with the wavelength of equal to or greater than 400 nm and equal to or less than 800 nm, the reflectance of 80% or more is obtained.

It is more preferable that in the first electrode 102 including aluminum and nickel, the nickel be precipitated locally (in particular, in the vicinity of the surface of the first electrode 102 and the interface between the first electrode 102 and an EL layer 106). This is because good electric connection between the EL layer 106 and the electrode can be obtained and element characteristics can be improved by using the electrode in which the nickel is precipitated locally.

The first electrode 102 can be formed by a sputtering method or a vacuum evaporation method, or the like. In particular, a sputtering method is preferably used. In order for the first electrode 102 to have a structure in which the nickel is precipitated locally, heat treatment is preferably performed after the first electrode 102 including aluminum and nickel is formed by a sputtering method, or the like. This is because the nickel in aluminum tends to be precipitated in the vicinity of a surface by heat treatment. The heat treatment is preferably performed at equal to or greater 150° C. and equal to or less than 350° C., typically at equal to or greater 200° C. and equal to or less than 300° C. Further, there is no particular limitation on the timing of the heat treatment; however, in order to achieve favorable element characteristics, the heat treatment is preferably performed before the EL layer 106 is formed.

In the case where the above-described heat treatment is performed before the EL layer 106 is formed, it is more preferable that etching treatment be performed on the surface of the first electrode 102 before the EL layer 106 is formed. This is because the nickel is precipitated on the surface by the etching treatment, whereby electric characteristics of the interface between the EL layer 106 and the first electrode 102 can be improved. The above etching treatment can be performed by any method as long as the nickel can be precipitated on the surface. As the etching, either dry etching or wet etching can be employed. Further, the technical significance of the above etching treatment is that the nickel is precipitated on the surface. Therefore, the surface treatment is not specifically limited to the etching treatment, as long as the technical significance can be realized. Specifically, for example, polishing treatment such as CMP or the like may be performed. Further, in order for the nickel to be favorably precipitated on the surface, the etching treatment is preferably performed after the heat treatment. However, it is not necessarily limited to this timing.

Furthermore, when an insulating film (an oxide film, or the like) is not formed on the surface, for example, by performing a manufacturing step of the first electrode 102 in a vacuum atmosphere, the above etching treatment may not be performed. This is because the nickel has already been precipitated on the surface.

Moreover, as another example of an aluminum alloy that can be used for the electrode, there is an alloy of aluminum and titanium, or the like. However, when an alloy of aluminum and titanium is used, a problem arises in that electric characteristics (in particular, a hole-injection property) are impaired by oxidation of aluminum. In order to solve this problem, for example, titanium or titanium oxide is stacked on the surface of an alloy of aluminum and titanium, whereby oxidation of aluminum can be prevented. However, since a reflecting property of titanium or titanium oxide is not high, in this case, a problem arises in that light extraction efficiency is decreased again. Accordingly, when an alloy of aluminum and titanium oxide is used, it is difficult that both electric characteristics and a reflecting property are kept at high level.

In this regard, by using an alloy of aluminum and nickel disclosed in this embodiment, both electric characteristics and a reflecting property can be kept at high level. Therefore, the above material and structure are extremely preferable, as for a reflective electrode of the light-emitting element.

<EL layer>

The EL layer 106 described in this embodiment has at least a layer 110 including a composite material which is formed in contact with the first electrode 102 and a light-emitting layer 114. The EL layer 106 is formed so that the first electrode 102 is in contact with the layer 110 including a composite material, whereby hole injection to the EL layer is facilitated and electrical characteristics of the light-emitting element can be greatly improved. Here, the nickel in the first electrode 102 can be diffused into the EL layer 106 (in particular, the layer 110 including a composite material), depending on a manufacturing condition of the EL layer 106 (in particular, the layer 110 including a composite material). Thus, when the nickel in the first electrode 102 is diffused, more preferable electrical characteristics can be realized. As diffusion treatment of the nickel, for example, plasma treatment of the first electrode 102 and the layer 110 including a composite material or heat treatment can be given.

Further, in the structure shown in FIG. 1, the EL layer 106 has the layer 110 including a composite material, a hole-transport layer 112, a light-emitting layer 114, an electron-transport layer 116, and an electron-injection layer 118. For the components other than the layer 110 including a composite material and the light-emitting layer 114, omissions, changes, additions, or the like may be made as appropriate. In other words, the stacked-layer structure of the EL layer 106 is formed in such a way that a light-emitting layer and a layer including a composite material are combined with layers including a substance having a high electron-transport property, a substance having a high hole-transport property, a substance having a high electron-injection property, a substance having a high hole-injection property, a substance having a bipolar property (a high electron-transport property and a high hole-transport property), or the like, as appropriate.

Furthermore, when a micro-cavity (micro resonator) structure is applied, color purity can be improved. In this case, it is necessary for the light path length between the first electrode 102 and the second electrode 104 to be about an integral multiple of the wavelength of light emitted from the light-emitting layer (or the wavelength of light which is desired to be extracted). Specifically, the thickness of the EL layer is set in accordance with the light path length. Note that the above description "integral multiple" is not limited to strict integral multiple. For example, a difference of about 10% is within the allowed margin of error. Furthermore, "the wavelength of light emitted from the light-emitting layer" may be wavelength in the range included in the emission spectrum. That is, "integral multiple of the wavelength of light emitted from the light-emitting layer" means approximate integral multiple of the wavelength in the range included in the emission spectrum.

Various methods can be used for forming the EL layer 106 regardless of a dry method or a wet method. For example, a vacuum evaporation method, an inkjet method, a spin coating method, or the like may be used. As described above, the EL layer 106 is formed with a stacked structure of the layer including a composite material, the hole-transport layer, the light-emitting layer, the electron-transport layer, the electron-injection layer (a buffer layer), and the like, and these layers are formed using a common deposition method, so that simplification of a process or the like can be performed.

Specific materials for forming each of the above layers are given below.

<EL Layer—a Layer Including a Composite Material>

The layer 110 including a composite material is a layer including a composite material in which an acceptor substance is contained in an organic compound having a high hole-transport property. By using such a composite material, an excellent hole-injection property from the first electrode 102 can be obtained. The layer 110 including a composite material can be formed by co-evaporation of a substance having a high hole-transport property and an acceptor substance, for example.

Note that in this specification or the like, the word "composite" means a state in which a plurality of materials are mixed and charges can be transferred between the materials.

There is no particular limitation on a substance of the organic compound used for the composite materials as long as the substance has a hole-transport property higher than an electron-transport property. As the organic compound, various compounds such as an aromatic amine compound, a carbazole derivative, an aromatic hydrocarbon, a high molecular compound (an oligomer, a dendrimer, a polymer), or the like can be used. Note that an organic compound used for the composite material preferably has a high hole-transport property. Specifically, a substance with a hole mobility of $10^{-6}$ cm$^2$/Vs or more is preferably used. The organic compounds which can be used for the composite material will be specifically shown below.

As the organic compound used for the composite material, aromatic amine compounds such as 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), N,N'-bis[4-[bis(3-methylphenyl)amino]phenyl]-N,N'-diphenyl-[1,1'-biphenyl]-4,4'-diamine (abbreviation: DNTPD), 1,3,5-tris[N-(4-diphenylaminophenyl)-N-phenylamino]benzene (abbreviation: DPA3B), 9-phenyl-3-[4-(10-phenyl-9-anthryl)phenyl]-9H-carbazole (abbreviation: PCzPA), 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-bis[N-(1-naphtyl)-N-phenylamino]biphenyl (abbreviation: NPB), N,N-bis(3-methylphenyl)-N,N-diphenyl-[1,1'-biphenyl]-4,4'-diamine (abbreviation: TPD); carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene; and aromatic hydrocarbon compounds such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracen, tetracene, rubrene, perylene, 2,5,8,11-tetra(tert-butyl)perylene, pentacene, coronene, 4,4'-bis(2,2-diphenylvinyl)biphenyl (abbreviation: DPVBi), 9,10-bis[4-(2,2-diphenylvinyl)phenyl]anthracene (abbreviation: DPVPA) are given. Furthermore, high molecular compounds (oligomers, dendrimers, polymers, and the like) such as poly(N-vinylcarbazole) (abbreviation: PVK), poly(4-vinyltriphenylamine) (abbreviation: PVTPA), poly[N-(4-{N'[4-(4-diphenylamino)phenyl]phenyl-N'-phenylamino}phenyl)methacrylamide] (abbreviation: PTPDMA), poly[N,N'-bis(4-butylphenyl)-N,N'-bis(phenyl)benzidine] (abbreviation: Poly-TPD), can be used.

As the acceptor substance used for the composite material, organic compounds such as 7,7,8,8-tetracyano-2,3,5,6-tetrafluoroquinodimethane (abbreviation: $F_4$-TCNQ) and chloranil, and a transition metal oxide can be given. In particular, an oxide of a metal belonging to Groups 4 to 8 in the periodic table is preferably used. Specifically, vanadium oxide, niobium oxide, tantalum oxide, chromium oxide, molybdenum oxide, tungsten oxide, manganese oxide, and rhenium oxide having high electron-accepting properties, and the like are preferable. Among them, molybdenum oxide is particularly preferable because it is stable under air, has a low moisture absorption property, and is easily handled.

<EL Layer—Hole-Transport Layer>

The hole-transport layer 112 is a layer that contains a substance with a high hole-transport property. As the substance having a high hole-transport property, for example, aromatic amine compounds such as NPB, TPD, 4,4'-bis[N-(9,9-dimethylfluoren-2-yl)-N-phenylamino]biphenyl (abbreviation: DFLDPBi), or 4,4'-bis[N-(spiro-9,9'-bifluoren-2-yl)-N-phenylamino]biphenyl (abbreviation: BSPB) can be used. The substances described here are mainly substances having a hole mobility of $10^{-6}$ cm$^2$/Vs or higher. However, there is no particular limitation on the substances as long as the substance has a hole-transport property higher than an electron-transport property. Note that the hole-transport layer 112 is not limited to a single layer and may have a stacked structure of two or more layers.

For the hole-transport layer 112, a high molecular compound such as PVK, PVTPA, PTPDMA, or Poly-TPD can be used alternatively.

Furthermore, for the hole-transport layer 112, a composite material in which an acceptor substance is contained in the above-mentioned substance having a high hole-transport property can be used.

Alternatively, the hole-transport property may be adjusted by adding an organic compound having a hole-trapping property, a substance having a high electron-transport property, or a hole-blocking material to the hole-transport layer 112. The organic compound having a hole-trapping property preferably has an ionization potential lower than a substance having a high hole-transport property which is included in the hole-transport layer 112 by 0.3 eV or higher. In addition, as the substance having a high electron-transport property, the later-given substance that can be used for the electron-transport layer 116 or the like can be used. Further, for the hole-blocking material, a material having an ionization potential of 5.8 eV or higher, or a material having an ionization potential higher than a substance having a high hole-transport property which is included in the hole-transport layer by 0.5 eV or higher is preferably used. Note that the organic compound having a hole-trapping property or the substance having a high electron-transport property, which is added, may emit light; however, the color of such a substance is preferably similar to emission color of the light-emitting layer 114 in view of keeping excellent color purity.

<EL Layer—Light-Emitting Layer>

The light-emitting layer 114 is a layer containing a substance having a high light-emitting property, and can be formed using various materials. As the substance having a high light-emitting property, a fluorescent compound which emits fluorescence or a phosphorescent compound which emits phosphorescence can be used, for example. Since a phosphorescent compound has high emission efficiency, in the case where it is used for the light-emitting layer 114, an advantage of lower power consumption and the like can be obtained.

Examples of the phosphorescent compound that can be used for the light-emitting layer 114 are given below. As a material for blue light emission, bis[2-(4',6'-difluorophenyl) pyridinato-N,$C^{2'}$]iridium(III)tetrakis(1-pyrazolyl)borate (abbreviation: FIr6), bis[2-(4',6'-difluorophenyl)pyridinato-N,$C^{2'}$]iridium(III)picolinate (abbreviation: FIrpic), bis[2-(3', 5'-bis(trifluoromethylphenyl)pyridinato-N,$C^{2'}$]iridium(III) picolinate (abbreviation: Ir($CF_3$ ppy)$_2$(pic)), bis[2-(4',6'-difluorophenyl)pyridinato-N,$C^{2'}$]iridium(III)acetylacetonate (abbreviation: FIracac), and the like are given. As a material for green light emission, tris(2-phenylpyridinato-N,$C^{2'}$)iridium(III) (abbreviation: Ir(ppy)$_3$), bis[2-phenylpyridinato-N, $C^{2'}$]iridium(III)acetylacetonate (abbreviation: Ir(ppy)$_2$ (acac)), bis(1,2-diphenyl-1H-benzimidazolato)iridium(III) acetylacetonate (abbreviation: Ir(pbi)$_2$(acac)), bis(benzo[h] quinolinato)iridium(III)acetylacetonate (abbreviation: Ir(bzq)$_2$(acac)), or the like can be given. As a material for yellow light emission, bis(2,4-diphenyl-1,3-oxazolato-N,$C^{2'}$) iridium(III)acetylacetonate (abbreviation: Ir(dpo)$_2$(acac)), bis[2-(4'-perfluorophenylphenyl)pyridinato]iridium(III) acetylacetonate (abbreviation: Ir(p-PF-ph)$_2$(acac)), bis(2-phenylbenzothiazolo-N,$C^{2'}$)iridium(III)acetylacetonate (abbreviation: Ir(bt)$_2$(acac)), or the like can be given. As a material for orange light emission, tris(2-phenylquinolinato-N,$C^{2'}$)iridium(III) (abbreviation: Ir(pq)$_3$), bis(2-phenylquinolinato-N,$C^{2'}$)iridium(III)acetylacetonate (abbreviation: Ir(pq)$_2$(acac)), or the like can be given. As a material, for red light emission, an organometallic complex such as bis[2-(2'-benzo[4,5-α]thienyl)pyridinato-N,$C^{3'}$]iridium(III)acetylacetonate (abbreviation: Ir(btp)$_2$(acac)), bis(1-phenylisoquinolinato-N,$C^{2'}$)iridium(III)acetylacetonate (abbreviation: Ir(piq)$_2$(acac)), (acetylacetonato)bis[2,3-bis(4-fluorophenyl) quinoxalinato]iridium(III) (abbreviation: Ir(Fdpq)$_2$(acac)), 2,3,7,8,12,13,17,18-octaethyl-21H,23H-porphyrinatoplatinum(II) (abbreviation: PtOEP), or the like can be given. In addition, a rare earth metal complex such as tris(acetylacetonato)(monophenanthroline)terbium(III) (abbreviation: Tb(acac)$_3$(Phen)), tris(1,3-diphenyl-1,3-propanedionato) (monophenanthroline)europium(III) (abbreviation: Eu(DBM)$_3$(Phen)), or tris[1-(2-thenoyl)-3,3,3-trifluoroacetonato](monophenanthroline)europium(III) (abbreviation: Eu(TTA)$_3$(Phen)) can get light emission (electron transition between different multiplicities) from a rare earth metal ion; therefore, such a rare earth metal complex can be used as a phosphorescent compound.

Examples of the fluorescent compound that can be used for the light-emitting layer 114 are given below. As a material for blue light emission, 4-(10-phenyl-9-anthryl)-4'-(9-phenyl-9H-carbazol-3-yl)triphenylamine (abbreviation: PCBAPA), N,N'-bis[4-(9H-carbazol-9-yl)phenyl]-N,N'-diphenylstilbene-4,4'-diamine (abbreviation: YGA2S),4-(9H-carbazol-9-yl)-4'-(10-phenyl-9-anthryl)triphenylamine (abbreviation: YGAPA), and the like can be given. As a material for green light emission, N-(9,10-diphenyl-2-anthryl)-N,9-diphenyl-9H-carbazol-3-amine (abbreviation: 2PCAPA), N-[9,10-bis (1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4 (9H-carbazol-9-yl)phenyl]-N-phenylanthracen-2-amine (abbreviation: 2YGABPhA), N,N,9-triphenylanthracen-9-amine (abbreviation: DPhAPhA), and the like can be given. As a material for yellow light emission, rubrene, 5,12-bis(1, 1'-biphenyl-4-yl)-6,11-diphenyltetracene (abbreviation: BPT), and the like can be given. As a material for red light emission, N,N,N',N'-tetrakis(4-methylphenyl)tetracene-5, 11-diamine (abbreviation: p-mPhTD), 7,14-diphenyl-N,N, N',N'-tetrakis(4-methylphenyl)acenaphtho[1,2-α]fluoranthene-3,10-diamine (abbreviation: p-mPhAFD), 2-(2-{2-[4-(dimethylamino)phenyl]ethenyl}-6-methyl-4H-pyran-4-ylidene)propanedinit rile (abbreviation: DCM1), 2-{2-methyl-6-[2-(2,3,6,7-tetrahydro-1H,5H-benzo[ij]quinolizin-9-yl)ethenyl]-4H-pyra n-4-ylidene}propanedinitrile (abbreviation: DCM2), and the like can be given.

Note that the light-emitting layer 114 may have a structure in which a substance having a high light-emitting property (guest material) is dispersed into another substance (host material). A light-emitting substance (host material) can be dispersed in various kinds of substances, and it is preferably dispersed in a substance that has a lowest unoccupied molecular orbital (LUMO) level higher than that of the light-emitting substance and has a highest occupied molecular orbital (HOMO) level lower than that of the light-emitting substance.

As the substance in which the substance having a light-emitting property is dispersed, a metal complex such as tris (8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl] benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), or bathocuproine (BCP); a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl) tripyrene (abbreviation: TPB3), 9,10-diphenylanthracene (abbreviation: DPAnth), or 6,12-dimethoxy-5,11-diphenylchrysene; an aromatic amine compound such as N,N-dipheyl-9-[4-(10-phenyl-9-anthryl)phenyl]-9H-carbazol-3-amine (abbreviation: CzAlPA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB, TPD, DFLDPBi, or BSPB; or the like can be used.

As the substance in which the light-emitting substance is dispersed, a plurality of kinds of substances may be used. For example, a substance which suppresses crystallization, such as rubrene, can be added to the substance in which the light-emitting substance is dispersed. In order to effectively perform energy transfer to the light-emitting substance, NPB or Alq, or the like can be added.

Thus, with a structure in which a substance having a high light-emitting property is dispersed in another substance, crystallization of the light-emitting layer 114 can be suppressed. Further, concentration quenching due to high concentration of the substance having a high light-emitting property can be suppressed.

A high molecular compound can be also used for the light-emitting layer 114. For example, as a material for blue light emission, poly(9,9-dioctylfluorene-2,7-diyl) (abbreviation: POF), poly[(9,9-dioctylfluorene-2,7-diyl)-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation: TAB-PFH), or the like can be given. As a light-emitting material for green light emission, poly(p-phenylenvinylene) (abbreviation: PPV), poly[(9,9-dihexylfluorene-2,7-diyl)-alt-co-(benzo[2,1,3]thiadiazol-4,7-diyl)](abbreviation: PFBT), poly[(9,9-dioctyl-2,7-divinylenfluorenylene)-alt-co-(2-methoxy-5-(2-ethylhexyloxy)-1,4-phenylene)], or the like can be given. Furthermore, as materials for orange to red light emission, poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD), and the like can be given.

Further, the light-emitting layer 114 is not limited to a single layer but may be a stack of two or more layers including any of the above-described substances.

<EL layer—Electron-Transport Layer>

The electron-transport layer 116 is a layer containing a substance with a high electron-transport property. As the substance having a high electron-transport property, metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(H) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), bis[2-(2-benzothiazolyl)phenolato]zinc(II) (abbreviation: ZnBTZ), and the like can be given. Furthermore, besides the above metal complexes, heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ01), bathophenanthroline (abbreviation: BPhen), and bathocuproine (abbreviation: BCP) can be used. The substances described here are mainly substances having an electron mobility of $10^{-6}$ cm$^2$/Vs or higher. However, there is no particular limitation on the substances as long as the substance has an electron-transport property higher than a hole-transport property. Note that the electron-transport layer 116 is not limited to a single layer and may be have a stacked layer of two or more layers.

For the electron-transport layer 116, a high molecular compound can be used. For example, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy), or the like can be used.

Further, by addition of an organic compound having an electron-trapping property or a substance having a high hole-transport property to the electron-transport layer 116, the electron-transport property may be controlled. As the organic compound having an electron-trapping property, an organic compound having an electron affinity larger than the substance having a high electron-transport property which is included in the electron-transport layer 116 by 0.30 eV or higher is preferably used. In addition, as the substance having a high hole-transport property, substances that can be used for the hole-transport layer 112 and the like can be used. Note that the organic compound having an electron-trapping property and the substance having a high hole-transport property, which are added may emit light; however, the color of which is preferably similar to one of the emission light of the light-emitting layer 114 in view of keeping excellent color purity.

<EL Layer—Electron-Injection Layer>

The electron-injection layer 118 (also referred to as a buffer layer) is a layer including a substance having a high electron-injection property. As the substance having a high electron-injection property, any of the following alkali metals, alkaline earth metals, rare earth metals, or compounds thereof can be used: lithium (Li), cesium (Cs), magnesium (Mg), calcium (Ca), ytterbium (Yb), lithium fluoride (LiF), calcium fluoride (CaF$_2$), cesium fluoride (CsF), magnesium fluoride (MgF$_2$), lithium carbonate (Li$_2$CO$_3$), cesium carbonate (Cs$_2$CO$_3$), lithium oxide (Li$_2$O), erbium fluoride (ErF$_3$), lithium acetylacetonate (abbreviation: Li(acac)), 8-quinolinolato-lithium (abbreviation: Liq), and the like. In particular, it is preferable to use a lithium compound such as lithium fluoride (LiF), lithium oxide (Li$_2$O), lithium carbonate (Li$_2$CO$_3$), lithium acetylacetonate (abbreviated to Li(acac)), or 8-quinolinolato-lithium (abbreviated to Liq) because of their excellent electron-injection properties.

Further, the electron-injection layer 118 may be formed by adding a donor substance to a layer including a substance having an electron-transport property. As the donor substance, an alkali metal, an alkaline earth metal, a rare earth metal, or a compound thereof can be given. For example, a layer of Alq which includes magnesium (Mg), a layer of Alq which includes magnesium (Li), or the like can be used.

Further, the electron-injection layer 118 is not limited to a single layer but may be a stack of two or more layers including any of the above-described substances.

<Second Electrode>

The second electrode 104 is an electrode that functions as a cathode and has a light-transmitting property. For example, in order to effectively extract light generated in the light-emitting layer to the outside, the second electrode 104 preferably has a transmissivity of 30% or more with respect to light in the visible light region (in the wavelength of equal to or greater than 400 nm and equal to or less than 800 nm). Further, when a micro-cavity (micro resonator) structure is applied, the second electrode 104 preferably has a transmissivity of 30 to 80% and a reflectivity of 30 to 60%. Note that the total of the transmissivity and the reflectivity does not exceed 100%.

As the second electrode 104, a variety of materials (for example, metals, alloys, electrically conductive compounds, a mixture thereof, or the like) can be used. For example, it is possible to use a light-transmitting conductive oxide material such as indium oxide-tin oxide (ITO: indium tin oxide), indium oxide-tin oxide which contains silicon or silicon oxide, indium oxide-zinc oxide (IZO: indium zinc oxide), or indium oxide which contains tungsten oxide and zinc oxide. When these light-transmitting conductive oxide materials are used, the second electrode 104 is preferably formed to have a thickness about 70 nm to 100 nm in consideration of the transmissivity in the visible light region and the conductivity. Note that such a conductive oxide is generally deposited by a sputtering method, but may also be formed by an inkjet method, a spin coating method, or the like by application of a sol-gel method or the like. When a sputtering method is used, for example, indium oxide and zinc oxide (IZO) can be formed using indium oxide to which zinc oxide is added at 1 to 20 wt % as a target. In addition, indium oxide containing tungsten oxide and zinc oxide can be formed by a sputtering method using a target in which tungsten oxide is contained at 0.5 to 5 wt % and zinc oxide is contained at 0.1 to 1 wt % in indium oxide. Besides, gold (Au), platinum (Pt), nickel (Ni), tungsten (W), chromium (Cr), molybdenum (Mo), iron (Fe), cobalt (Co), copper (Cu), palladium (Pd), titanium (Ti), nitride of these metal materials (for example, titanium nitride), and the like may be used. Alternatively, a material having a low work function (equal to or less than 3.8 eV) of a metal, an alloy or the like may be used. For example, aluminum (Al), silver (Ag), an aluminum alloy (AlSi), or the like can be used. Moreover, any of the following materials can be used: elements that belong to Group 1 or Group 2 of the periodic table, that is, alkali metals such as lithium (Li) and cesium (Cs) or alkaline-earth metals such as magnesium (Mg), calcium (Ca), or strontium (Sr), or alloys thereof (e.g., magnesium-silver alloy (Mg—Ag) and aluminum-lithium alloy (Al—Li)); rare earth metals such as europium (Eu) or ytterbium (Yb), or alloys thereof; or the like. As a manufacturing method thereof, a vacuum evaporation method, a sputtering method, an ink-jet method, or the like may be used. When these metal materials are used, the second electrode 104 is preferably formed to have a thickness about 5 nm to 20 nm in consideration of a balance of the transmissivity and the conductivity.

Among the above-described materials, silver (Ag) can increase extraction efficiency of emitted light. Yet, since Ag has difficulty in injecting electrons to the EL layer, in the case of using AG, the buffer layer is preferably provided to have a structure where a donor substance is added to a layer including a substance having an electron-transport property. At the same time, in terms of mass productivity, it is preferable to use a buffer layer having a structure where no donor substance is added, not the structure in which a donor substance is added. Even in the structure where a donor substance (e.g., a lithium compound such as lithium fluoride) is not added as the buffer layer, magnesium-silver alloy (Mg—Ag), which is an alloy including silver, can smoothly inject electrons to the EL layer and has good conductivity. Therefore, magnesium-silver alloy is preferably used as the second electrode 104. When the magnesium-silver alloy that includes magnesium in large amounts is used, the amount of light absorbed by Mg is increased, so that extraction of emitted light is less efficient. Therefore, the volume ratio of silver to magnesium in a magnesium-silver alloy is preferably 8:2 (=Ag:Mg) or higher.

Note that the second electrode 104 is not limited to a single layer but may be a stack of two or more layers containing the above-described substances. For example, the second electrode 104 may have a structure in which, over the thin film of the above-described alkali metal, alkaline earth metal, or alloy thereof, a film of a light-transmitting conductive oxide such as indium oxide-tin oxide (ITO), indium oxide-tin oxide which contains silicon or silicon oxide, indium oxide-zinc oxide (IZO), or indium oxide containing tungsten oxide and zinc oxide is stacked.

As described above, the first electrode including aluminum and nickel is used in the light-emitting element described in this embodiment, whereby the reflecting property of the first electrode is increased so as to improve light extraction efficiency. In addition, the electric characteristics of the interface between the first electrode and the EL layer is improved to reduce driving voltage. That is, according to one embodiment of the invention disclosed, the light-emitting element with electric characteristics (low power consumption) and an excellent reflecting property (high emission efficiency) maintained at high levels can be achieved. Furthermore, use of aluminum and nickel which is relatively inexpensive, which leads to reduction in manufacturing cost.

Further, the light-emitting element described in this embodiment has a so-called top-emission structure and high emission efficiency. Therefore, by employing the top-emission structure and the structure of the above first electrode, a light-emitting element with high emission efficiency can be provided.

Furthermore, a variety of light-emitting devices, lighting devices, and the like can be manufactured by using the above light-emitting element. Thus, light-emitting devices and lighting devices with high performance can be provided while a production cost is suppressed.

Further, by including a material that can be used in a process of manufacturing element substrate having a transistor and the like, the first electrode described in this embodiment is highly suitable for use in a process of manufacturing an element substrate. Therefore, it is very effective when one embodiment of the disclosed invention is applied to an active matrix type light-emitting device.

Embodiment 2

In Embodiment 2, an example of a light-emitting element in which a plurality of light-emitting units are stacked (hereinafter this light-emitting element is referred to as a stacked-type light-emitting element) will be described with reference to FIG. 2.

<Structure of Light-Emitting Element>

Figure 2:
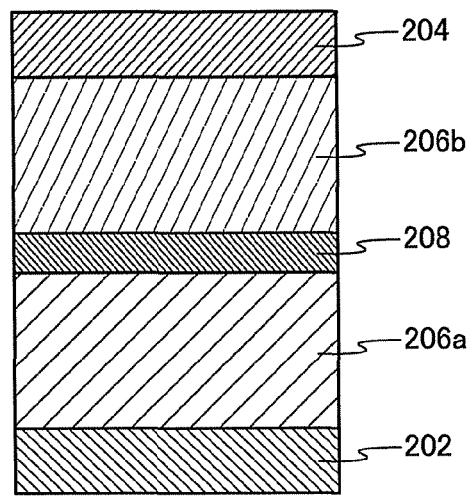
FIG. 2 illustrates an example of a light-emitting element.

The light-emitting element shown in FIG. 2 has a first electrode 202, a second electrode 204, a first EL layer 206a and a second EL layer 206b which are interposed between the first electrode 202 and the second electrode 204, and a charge generation layer 208 which is interposed between the first EL layer 206a and the second EL layer 206b. Here, the structures of the first electrode 202 and the second electrode 204 are similar to those of the first electrode 102 and the second electrode 104 described in Embodiment 1. Further, the structures of the first EL layer 206a and the second EL layer 206b are similar to that of the EL layer 106 described in the above embodiment. Note that the first EL layer 206a and the second EL layer 206b may have either the same structure or different structures.

The charge-generation layer 208 has a function of injecting electrons into one of the EL layers and injecting holes into the other of the EL layers when voltage is applied between the first electrode 202 and the second electrode 204. Note that the charge generation layer 208 may have a single-layer structure or a stacked structure. In the case of a stacked structure, for example, a structure in which a layer having a function of injecting electrons and a layer having a function of injecting holes are stacked can be employed. In addition, a layer included in the EL layer may also serve as the charge generation layer 208.

As the hole-injection layer, a layer formed from a semiconductor or an insulator, such as molybdenum oxide, vanadium oxide, rhenium oxide, or ruthenium oxide, can be used. Alternatively, a layer formed from a material of a substance having a high hole-transport property to which an acceptor substance is added may be used. The layer including a substance having a high hole-transport property and an acceptor substance is formed with the composite material described in the above embodiment and includes, as an acceptor substance, 7,7,8,8-tetracyano-2,3,5,6-tetrafluoroquinodimethane (abbreviation: $F_4$-TCNQ) or metal oxide such as vanadium oxide, molybdenum oxide, or tungsten oxide. As the substance having a high hole-transport property, various compounds such as an aromatic amine compound, a carbazole derivative, aromatic hydrocarbon, and a high molecular compound (such as an oligomer, a dendrimer, or a polymer) can be used. In addition, although a substance having an hole mobility of $10^{-6}$ cm$^2$/Vs or higher is preferably used for the substance having a high hole-transport property, other substances may also be used as long as they have a higher hole-transport property than an electron-transport property. The composite material including the substance having a high hole-transport property and the acceptor substance is excellent in a carrier-injection property and a carrier-transport property. Therefore, by using the composite material, low-voltage driving and low-current driving can be realized.

As the layer that injects electrons, a layer formed from a semiconductor or an insulator, such as lithium oxide, lithium fluoride, or cesium carbonate, can be used. Alternatively, a layer formed from a material of a substance having a high electron-transport property to which a donor substance is added can be used. As the donor substance, an alkali metal, an alkaline-earth metal, a rare earth metal, a metal belonging to Group 13 of the periodic table, an oxide or carbonate of any of these, or the like can be used. For example, lithium (Li), cesium (Cs), magnesium (Mg), calcium (Ca), ytterbium (Yb), indium (In), lithium oxide, cesium carbonate, or the like is preferably used. Alternatively, an organic compound such as tetrathianaphthacene may be used as the donor substance. As the substance having a high electron-transport property, the materials described in the above embodiment can be used. In addition, as the substance having a high electron-transport property, although a substance having an electron mobility of $10^{-6}$ cm$^2$/Vs or higher is preferably used, although other substances may also be used as long as they have a higher electron-transport property than a hole-transport property. The composite material including the substance having a high electron-transport property and the donor substance is excellent in a carrier-injection property and a carrier-transport property. Therefore, by using the composite material, low-voltage driving and low-current driving can be realized.

Further, the electrode materials described in the above embodiment can be used for the charge-generating layer 208. For example, the charge-generating layer 208 may be formed by combining a layer including a substance having a high hole-transport property and a metal oxide with a transparent conductive film. Note that a layer having a high light-transmitting property is preferably used as the charge-generating layer 208 in terms of light extraction efficiency.

Although the light-emitting element having two EL layers has been described in this embodiment, the present invention can be similarly applied to a light-emitting element in which three or more EL layers are stacked. In that case, it is preferable that a plurality of EL layers be connected to each other with a charge generation layer therebetween. By providing a charge generation layer between EL layers, luminance can be improved while low current density is kept, and the lifetime of the element can be prolonged.

Further, by forming the EL layers to emit light of different colors, an emission color that is provided by the light-emitting element as a whole can be controlled. For example, in the light-emitting element having two EL layers, an emission color of the first EL layer and an emission color of the second EL layer are made to be complementary colors, whereby the light-emitting element as a whole can produce white emission. Here, the complementary colors refer to colors that can produce an achromatic color when they are mixed. Further, the same can be applied to a light-emitting element having three EL layers. For example, the light-emitting element as a whole can provide white light emission when the emission color of the first EL layer is red, the emission color of the second EL layer is green, and the emission color of the third EL layer is blue.

This embodiment can be implemented in appropriate combination with the other embodiments.

Embodiment 3

In this embodiment, an example of a light-emitting device that has a light-emitting element is described with reference to drawings.

First, an example of an active-matrix light-emitting device is described with reference to FIGS. 3A and 3B. FIG. 3A is a top view of the light-emitting device, and FIG. 3B is a cross-sectional view taken along lines A-A' and B-B' of FIG. 3A. The light-emitting device includes an element substrate 310 and a driver circuit portion (a source side driver circuit) 301, a pixel portion 302, a driver circuit portion (a gate side driver circuit) 303, and the like, over the element substrate 310. A filler is filled in a region 307 surrounded by the element substrate 310, a sealing substrate 304 and a sealing material 305. As a filler, an inert gas (such as nitrogen or argon) or a sealing material is used.

A lead wiring 308 is connected to the driver circuit portion 301 and the driver circuit portion 303. Note that the lead wiring 308 is a wiring for transmitting signals that are to be inputted to the driver circuit portion, and receives a video signal, a clock signal, a start signal, a reset signal, and the like through an FPC 309 (flexible printed circuit). Although only the FPC 309 is illustrated, a printed wiring board (PWB) may be attached to the FPC. Note that the light-emitting device in this specification and the like includes a light-emitting device to which an FPC or a PWB is attached.

Note that, in the driver circuit portion 301 of the source side driver circuit, a CMOS circuit which is obtained by combining an n-channel TFT 323 and a p-channel TFT 324 is formed. Here, typically, the driver circuit portion 301 and the CMOS circuit are shown; however, it is needless to say that a PMOS circuit, an NMOS circuit, or other circuits which are necessary can be formed.

The pixel portion 302 includes a switching TFT 311, a current controlling TFT 312, and a first electrode 313 electrically connected to a drain of the current controlling TFT 312. Although only one pixel is typically shown here, the pixel portion 302 includes a plurality of pixels. An insulator 314 is formed to cover an end portion of the first electrode 313. The insulator 314 can be formed by using either a material of a negative type which becomes insoluble in an etchant by light irradiation or a material of a positive type which becomes soluble in an etchant by light irradiation. For example, the insulator 314 can be formed by using a positive photosensitive acrylic resin.

An upper edge portion or a lower edge portion of the insulator 314 has preferably a curved surface. Thus, step coverage can be improved. For example, when a positive type photosensitive acrylic is used as a material for the insulator 314, the upper edge portion thereof is preferably formed as a curved surface having a curvature radius of about 0.2 µm to 3 µm.

Over the first electrode 313, an EL layer 316 and a second electrode 317 are formed. A light-emitting element 318 has the first electrode 313, the EL layer 316 and the second electrode 317. The structures described in the above embodiments can be applied to the first electrode 313, the EL layer 316, and the second electrode 317.

The EL layer 316 can be formed by any of a variety of methods such as an evaporation method, an ink-jet method or a spin coating method. Further, the structures described in the above embodiments can be applied to the EL layer 316. The EL layer 316 is not limited to use an organic material, and may be use an inorganic material.

Note that it is preferable to use an epoxy resin for the sealing material 305. Furthermore, it is preferable to use a material that allows permeation of moisture or oxygen as little as possible. As the sealing substrate 304, a plastic substrate formed of FRP (Fiberglass-Reinforced Plastics), PVF (polyvinyl fluoride), polyester, acrylic, or the like can be used besides a glass substrate or a quartz substrate.

In addition, although this embodiment shows the structure of a driver circuit-integrated type, a driver circuit may be separately formed and be electrically connected to each other.

Figure 4A:
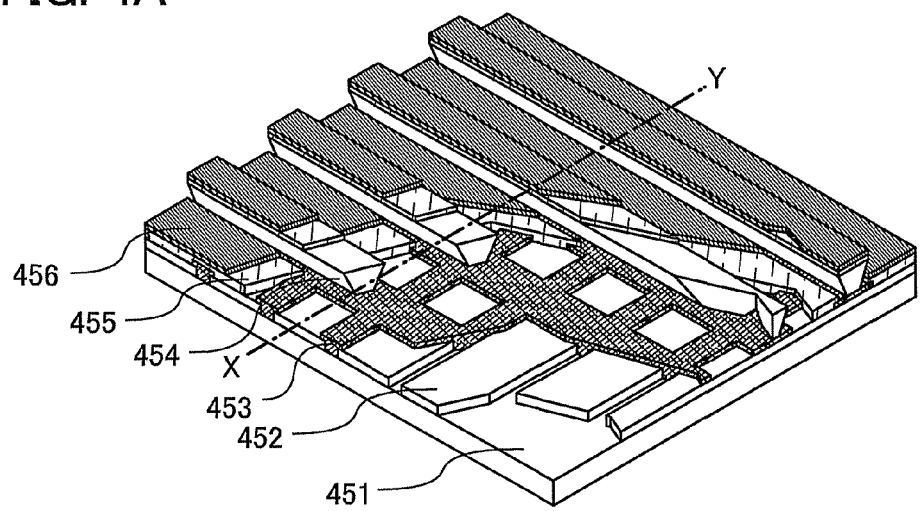
FIGS. 4A and 4B illustrate an example of a light-emitting device.
Figure 4B:
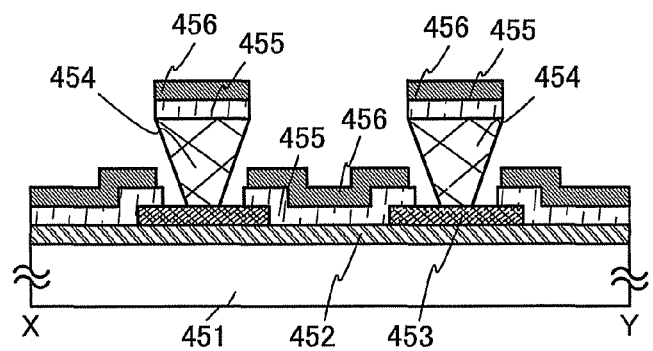

Although an active matrix light-emitting device is shown in FIGS. 3A to 3B, a passive matrix light-emitting device can be manufactured. FIGS. 4A and 4B illustrate an example of a passive matrix light-emitting device. Note that FIG. 4A is a perspective view of the light-emitting device, and FIG. 4B is a cross-sectional view taken along a line X-Y in FIG. 4A.

In FIGS. 4A and 4B, an electrode 452, an EL layer 455 and an electrode 456 are provided over a substrate 451. The EL layer 455 is provided between the electrode 452 and the electrode 456. Edge portions of the electrode 452 are covered with an insulating layer 453. In addition, a partition layer 454 is provided over the insulating layer 453.

Sidewalls of the partition layer 454 have a slant such that a distance between one sidewall and the other sidewall becomes narrower as the sidewalls gets closer to a surface of the substrate. In other words, a cross section taken along a line X-Y of the partition layer 454 is trapezoidal, and the lower base (a side which is in contact with the insulating layer 453) is shorter than an upper base (a side which faces the lower base and is not in contact with the insulating layer 453). By providing the partition layer 454 in this manner, the patterns of the EL layer 455 and the electrode 456 can be formed.

The above described active matrix light-emitting device or a passive matrix light-emitting device has the light-emitting element described in any of the above embodiments. Therefore, a light-emitting device with low power consumption and excellent characteristics can be achieved at low cost.

This embodiment can be implemented in appropriate combination with the other embodiments.

Embodiment 4

In this embodiment, examples of electronic appliances which include, as a part thereof, the light-emitting element or the light-emitting device described in any of the above embodiments are described.

As an electronic appliance using the light-emitting element or the light-emitting device according to one embodiment of the present invention disclosed, a camera, a goggle type display, a navigation system, an audio reproducing device, a computer, a game machine, a portable information terminal, an image reproducing device, and the like are given. Specific examples of such electronic devices are illustrated in FIGS. 5A to 5D.

Figure 5A:
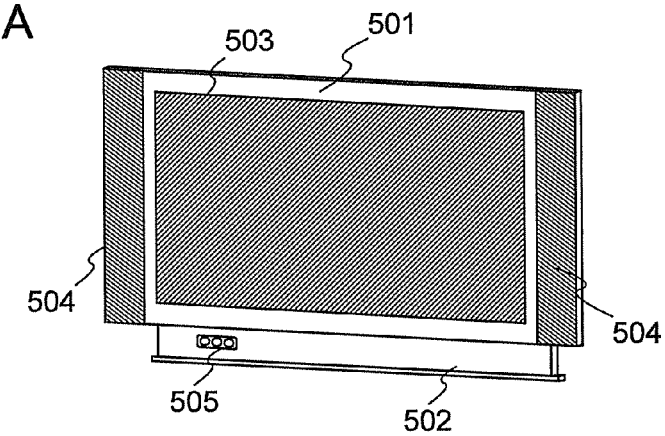
FIGS. 5A to 5D each illustrate an example of an electronic appliance.

FIG. 5A illustrates a television device, which includes a housing 501, a supporting stand 502, a display portion 503, speaker portions 504, a video input terminal 505, and the like. The display portion 503 of this television device includes the light-emitting device in which the light-emitting elements described in any of the above embodiments are arranged in matrix. According to one embodiment of the present invention disclosed, a television device having the light-emitting device with high emission efficiency and low power consumption is provided.

Figure 5B:
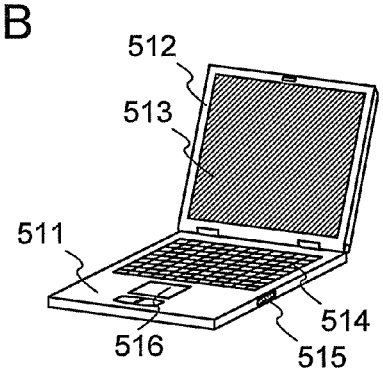

FIG. 5B illustrates a computer which includes a main body 511, a housing 512, a display portion 513, a keyboard 514, an external connection port 515, a pointing device 516, and the like. The display portion 513 of this computer includes the light-emitting device in which the light-emitting elements described in any of the above embodiments are arranged in matrix. According to one embodiment of the present invention disclosed, a computer having the light-emitting device with high emission efficiency and low power consumption is provided.

Figure 5C:
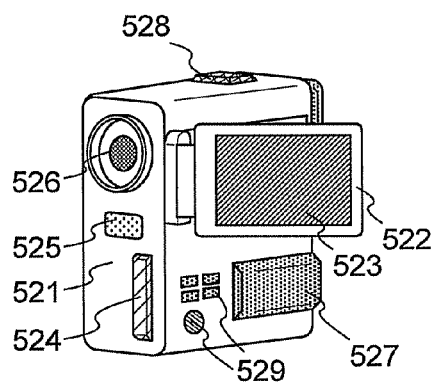

FIG. 5C illustrates a camera which includes a main body 521, a housing 522, a display portion 523, an external connection port 524, a remote control receiving portion 525, an image receiving portion 526, a battery 527, an audio input portion 528, operation keys 529, and the like. The display portion 523 of this camera includes the light-emitting device in which the light-emitting elements described in any of the above embodiments are arranged in matrix. According to one embodiment of the present invention disclosed, a camera having the light-emitting device with high emission efficiency and low power consumption is provided.

Figure 5D:
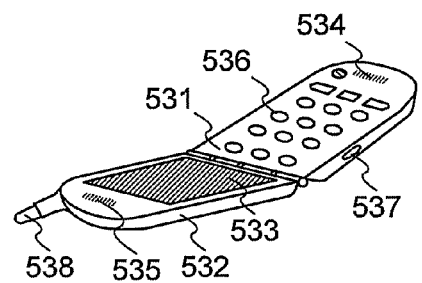

FIG. 5D illustrates a mobile phone which includes a main body 531, a housing 532, a display portion 533, an audio input portion 534, an audio output portion 535, operation keys 536, an external connection port 537, an antenna 538, and the like. The display portion 533 of this mobile phone includes the light-emitting device in which the light-emitting elements described in any of the above embodiments are arranged in matrix. According to one embodiment of the present invention disclosed, a mobile phone having the light-emitting device with high emission efficiency and low power consumption is provided.

Figure 6A:
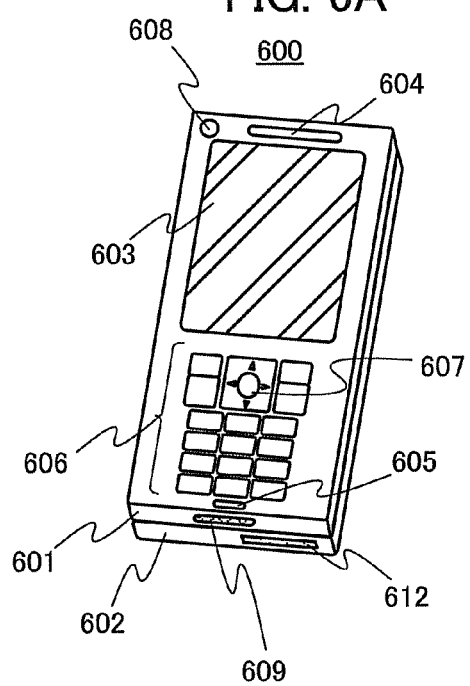
FIGS. 6A to 6C illustrate an example of an electronic appliance.
Figure 6B:
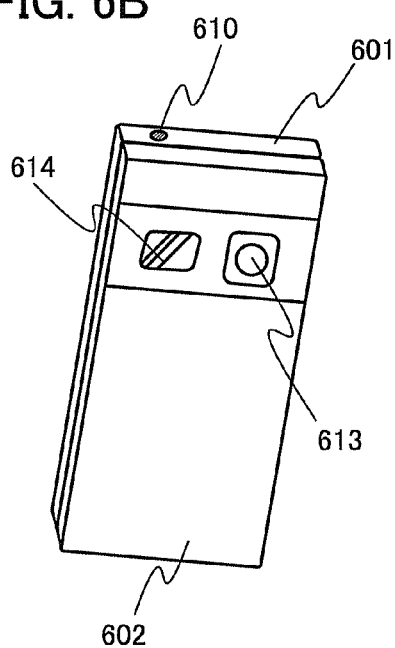
Figure 6C:
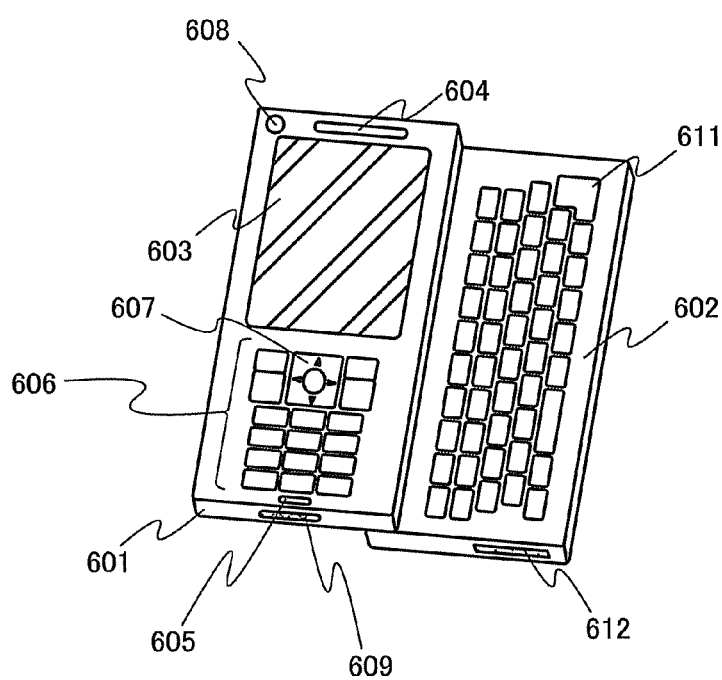

FIGS. 6A to 6C illustrate an example of a mobile phone having a structure different from that of the mobile phone of FIG. 5D. FIG. 6A is a front view, FIG. 6B is a rear view, and FIG. 6C is a front view in which two housings are slid. A mobile phone 600 has two housings, a housing 601 and a housing 602. The mobile phone 600 is a so-called smart phone which has both functions of a mobile phone and a portable information terminal, and incorporates a computer and can process a variety of data processing in addition to voice calls.

The housing 601 includes a display portion 603, a speaker 604, a microphone 605, operation keys 606, a pointing device 607, a front-face camera lens 608, an external connection terminal jack 609, an earphone terminal 610, and the like. The housing 602 includes a keyboard 611, an external memory slot 612, a rear-face camera 613, a light 614, and the like. In addition, an antenna is incorporated in the housing 601.

Further, in addition to the above structure, the mobile phone 600 may incorporate a non-contact IC chip, a small memory device, or the like.

The housings 601 and 602 which overlap with each other (illustrated in FIG. 6A) can be slid and are developed by being slid as illustrated in FIG. 6C. The display portion 603 includes the light-emitting device in which the light-emitting elements described in any of the above embodiments are arranged in matrix. Since the display portion 603 and the front-face camera lens 608 are provided in the same plane, the mobile phone can be used as a videophone. A still image and a moving image can be taken by the rear camera 613 and the light 614 by using the display portion 603 as a viewfinder.

With the use of the speaker 604 and the microphone 605, the mobile phone 600 can be used as a sound recording device (recorder) or a sound reproducing device. With use of the operation keys 606, operation of incoming and outgoing calls, simple information input for electronic mail or the like, scrolling of a screen displayed on the display portion, cursor motion for selecting information displayed on the display portion, and the like are possible.

If much information is needed to be treated, such as documentation, use as a portable information terminal, and the like, the use of the keyboard 611 is convenient. Further, by sliding the housings 601 and 602 which overlap with each other (see FIG. 6A), the housings 601 and 602 can be spread as shown in FIG. 6C. In the case where the mobile phone 600 is used as a portable information terminal, smooth operation with the keyboard 611 and the pointing device 607 can be performed. The external connection terminal jack 609 can be connected to various cables such as an AC adapter or a USB cable, whereby the mobile phone 600 can be charged or can perform data communication with a personal computer or the like. Further, by inserting a recording medium in the external memory slot 612, a larger amount of data can be stored and transferred.

The housing 602 is provided with the rear-face camera 613 and the light 614 on the rear face (FIG. 6B), and still images and moving images can be taken using the display portion 603 as a viewfinder.

Furthermore, in addition to the above-described functions and structures, the mobile phone may also have an infrared communication function, a USB port, a television one-segment broadcasting receiving function, a contactless IC chip, an earphone jack, or the like.

Figure 7:
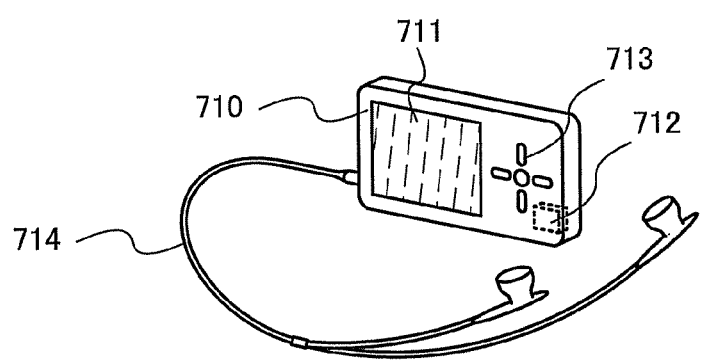
FIG. 7 illustrates an example of an electronic appliance.

FIG. 7 illustrates a digital audio player as an example of an audio reproducing device. The digital audio player illustrated in FIG. 7 includes a main body 710, a display portion 711, a memory portion 712, an operation portion 713, earphones 714, and the like. Note that a pair of headphones, wireless earphones, or the like can be used instead of the earphones 714. The display portion 711 includes the light-emitting device in which the light-emitting elements described in any of the above embodiments are arranged in matrix. According to one embodiment of the present invention disclosed, a digital audio player having the light-emitting device with high emission efficiency and low power consumption is provided.

As described above, the applicable range of the light-emitting element or the light-emitting device which is one embodiment of the present invention disclosed is so wide that the present invention can be applied to electronic devices of a variety of fields.

This embodiment can be implemented in appropriate combination with the other embodiments.

Embodiment 5

In this embodiment, examples of lighting devices which include the light-emitting element or the light-emitting device described in any of the above embodiments are described.

Figure 8:
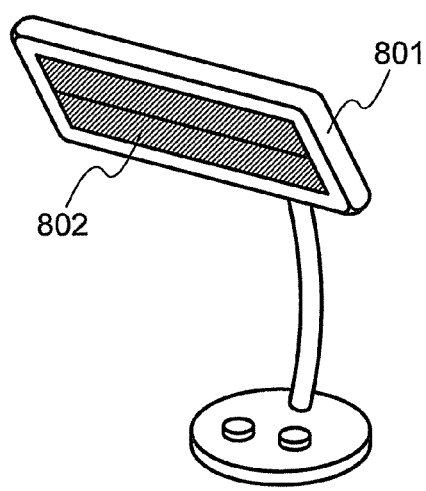
FIG. 8 illustrates an example of a lighting device.

FIG. 8 illustrates a desk lamp as an example of a lighting device. The desk lamp illustrated in FIG. 8 has a housing 801 and a light source 802. The light source 802 of the desk lamp includes the light-emitting element or the light-emitting device described in any of the above embodiments. According to one embodiment of the present invention disclosed, a desk lamp having the light-emitting device with high emission efficiency and low power consumption is provided.

Figure 9:
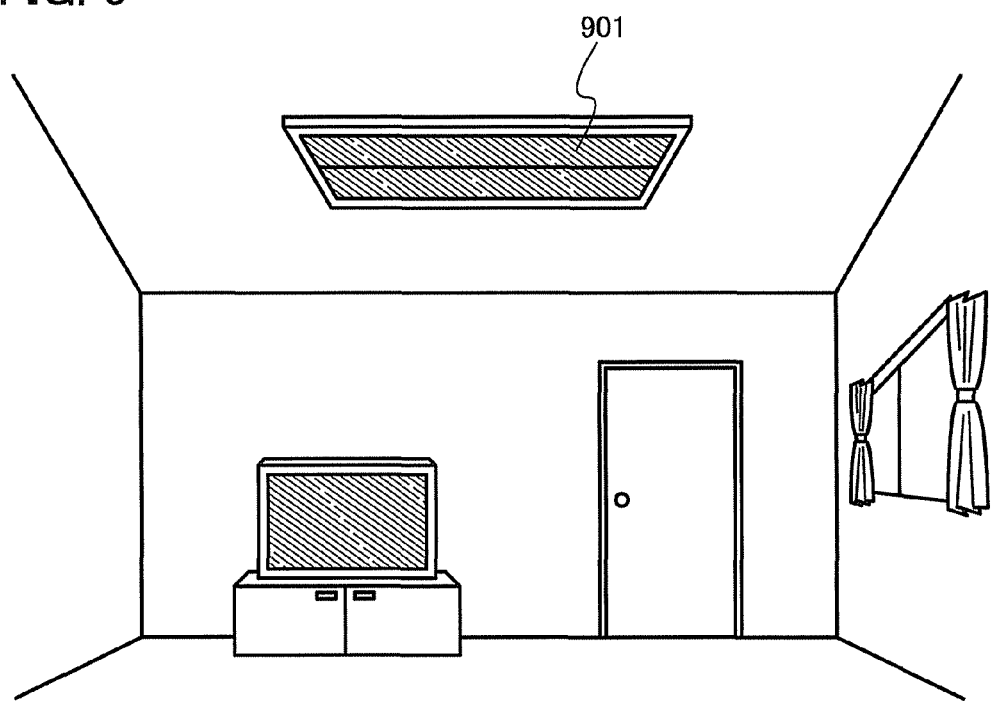
FIG. 9 illustrates an example of a lighting device.

FIG. 9 illustrates an indoor lighting device 901 as an example of a lighting device. The light-emitting element or the light-emitting device according to one embodiment of the present invention disclosed can be formed to have a large area and is preferably used as a lighting device. Further, since the light-emitting element or the light-emitting device has high emission efficiency and low power consumption, environmental load can be reduced, which is preferable.

Figure 10:
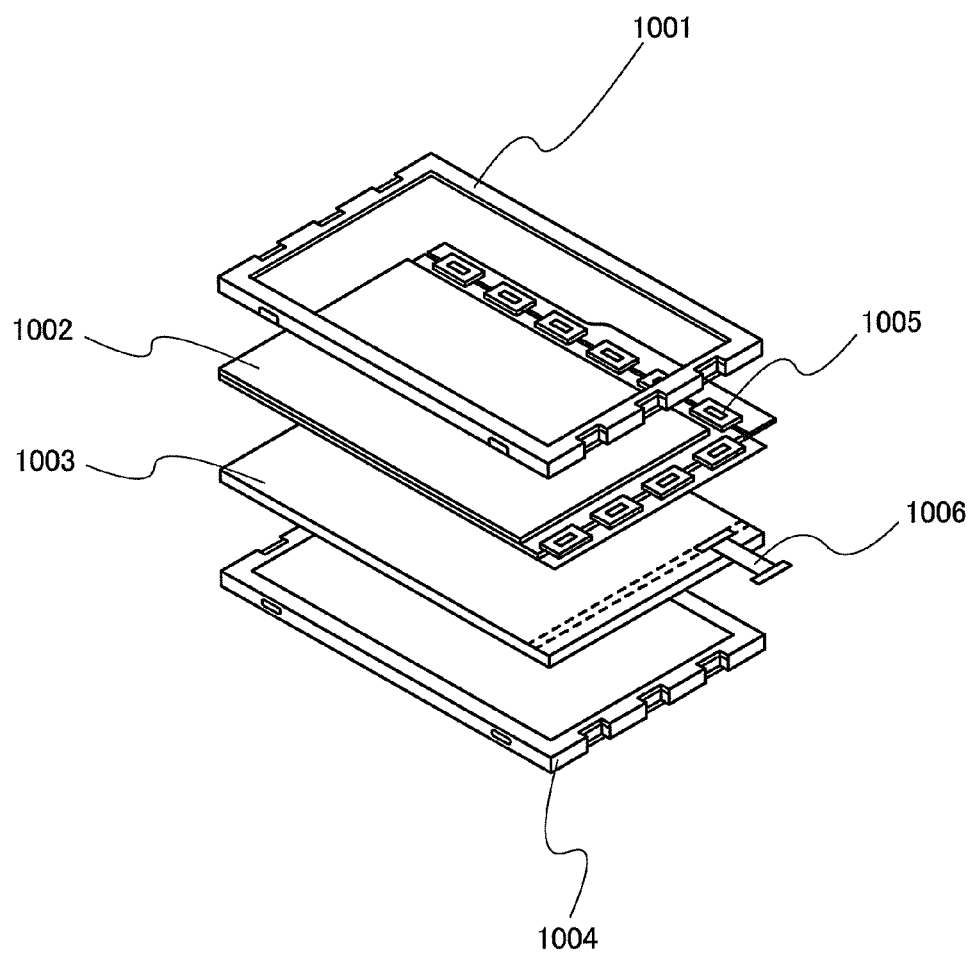
FIG. 10 illustrates an example of a lighting device.

FIG. 10 illustrates an example in which a lighting device is used as a backlight of a liquid crystal display device. The liquid crystal display device includes a housing 1001, a liquid crystal panel 1002, a backlight 1003, and a housing 1004. The liquid crystal panel 1002 is connected to a driver IC 1005. The backlight 1003 includes the light-emitting element or the light-emitting device described in any of the above embodiments and power is supplied from a terminal 1006 to the backlight 1003. The light-emitting element or the light-emitting device according to one embodiment of the present invention disclosed can be easily formed to have a large area and is preferably used as a backlight of a liquid crystal display device. Further, since the light-emitting element or the light-emitting device has high emission efficiency and low power consumption, environmental load can be reduced, which is preferable.

This embodiment can be combined with any of the other embodiments as appropriate.

Example 1

In this example, a method for manufacturing a light-emitting element using an electrode including aluminum and nickel, and measurement results of element characteristics thereof are described.

Figure 11:
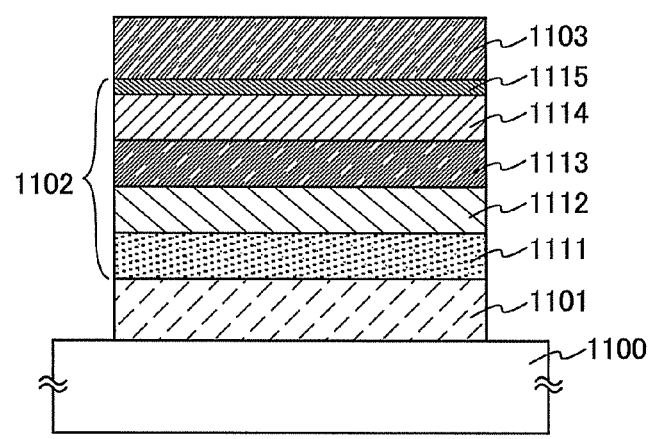
FIG. 11 illustrates an example of a structure of a light-emitting element.

Note that FIG. 11 illustrates a structure of a light-emitting element of this example, and the above-described electrode including aluminum and nickel is applied to a first electrode 1101.

First, an aluminum-nickel layer including a small amount of lanthanum was formed over a glass substrate 1100 by a sputtering method. The thickness of the aluminum-nickel layer was 300 nm. After that, the heat treatment was performed to the above aluminum-nickel layer at 250° C. for an hour, whereby the first electrode 1101 in which the nickel was precipitated was formed.

In this example, in order to achieve more favorable electrical characteristics, etching treatment was performed on the surface of the above first electrode 1101. For the etching treatment, dry etching treatment was performed twice under different conditions from each other. For both of the first dry etching treatment and the second dry etching treatment, an ICP (inductively coupled plasma) etching method was used. Here, the first dry etching treatment was performed under conditions with the pressure in treatment atmosphere of 1.9 Pa, the RF electric power of 450 W as the input electrical power to a coiled electrode (13.56 MHz), the RF electric power of 100 W as the input electrical power to an electrode on a substrate side (13.56 MHz), an etching gas of $BCl_3$ and $Cl_2$ (a gas flow rate of $BCl_3$: 70 sccm, a gas flow rate of $Cl_2$: 10 sccm). Treatment time was set to 3 seconds. Here, the second dry etching treatment was performed under conditions with the pressure in treatment atmosphere of 2.0 Pa, the RF electric power of 500 W as the input electrical power to a coiled electrode (13.56 MHz), the RF electric power of 50 W as the input electrical power to an electrode on a substrate side (13.56 MHz), an etching gas of $CF_4$ (a gas flow rate of $CF_4$: 80 sccm). Treatment time was set to 15 seconds.

Next, an EL layer 1102 in which a plurality of layers were stacked was formed over the first electrode 1101. In this example, the EL layer 1102 has a structure in which a first layer 1111 including a composite material, a second layer 1112 which is a hole-transport layer, the third layer 1113 which is a light-emitting layer, a fourth layer 1114 which is an electron-transport layer, and a fifth layer 1115 which is an electron-injection layer are stacked in that order.

The substrate 1100 provided with the first electrode 1101 was fixed on a substrate holder that was provided in a vacuum evaporation apparatus so that a surface provided with the first electrode 1101 faced downward. The pressure in the vacuum evaporation apparatus was reduced to approximately $10^{-4}$ Pa. Then, on the first electrode 1101, 9-phenyl-3-[4-(10-phenyl-9-anthryl)phenyl]-9H-carbazol (abbreviation: PCzPA) and molybdenum(VI) oxide were co-evaporated to form the first layer 1111 including a composite material. In this example, the weight ratio of PCzPA to molybdenum(VI) oxide was adjusted in deposition to be 1:1 (=PCzPA:molybdenum(VI) oxide) so that a 5-nm-thick film was formed. After that, the weight ratio of PCzPA to molybdenum(VI) oxide was adjusted in deposition to be 2:0.222 (=PCzPA:molybdenum (VI) oxide) so that a 120-nm-thick film was formed. Here, a co-evaporation method is an evaporation method by which evaporation is carried out from a plurality of evaporation sources at the same time within one process chamber.

Next, a 10-nm-thick film of 4,4'-bis[N-(1-naphthyl)-N-phenylamino]biphenyl (NPB) was deposited over the first layer 1111 by an evaporation method using resistive heating to form the second layer 1112 which was a hole-transport layer.

Next, the third layer 1113 which was the light-emitting layer was formed over the second layer 1112. Here, a 30-nm-thick film of 4-(10-phenyl-9-anthryl)-4'-(9-phenyl-9H-carbazol-3-yl)triphenylamine (abbreviation: PCBAPA) was deposited over the second layer 1112 by an evaporation method. Then, a 30-nm-thick film of 9-[4-(N-carbazolyl)] phenyl-10-phenylanthracene (abbreviation: CzPA) and 4-(10-phenyl-9-anthryl)-4'-(9-phenyl-9H-carbazol-3-yl) triphenylamine (abbreviation: PCBAPA) was deposited by a co-evaporation method. The weight ratio of CzPA to PCBAPA was adjusted in co-evaporation to be 1:0.1 (=CzPA: PCBAPA).

Furthermore, over the third layer 1113, a 10-nm-thick film of tris(8-quinolinolato)aluminum(III) (abbreviation: Alq) and, thereon, a 15-nm-thick film of bathophenanthroline (abbreviation: BPhen) were deposited by an evaporation method using resistance heating to form the fourth layer 1114 which was an electron-transport layer.

Moreover, over the fourth layer 1114, a 1-nm-thick film of lithium fluoride (LiF) was deposited to form the fifth layer 1115 which was an electron-injection layer.

Finally, a-10-nm-thick film of magnesium-silver alloy (Mg—Ag) (a mixture material of Mg and Ag; the ratio of Mg to Ag=1:10(M g: Ag)) and a 50-nm-thick film of ITO were deposited to form the second electrode 1103.

The thus obtained light-emitting element was sealed in a glove box containing a nitrogen atmosphere so as not to be exposed to air. Then, operation characteristics of this light-emitting element were measured. Note that the measurements were carried out at room temperature (25° C.).

Figure 12:
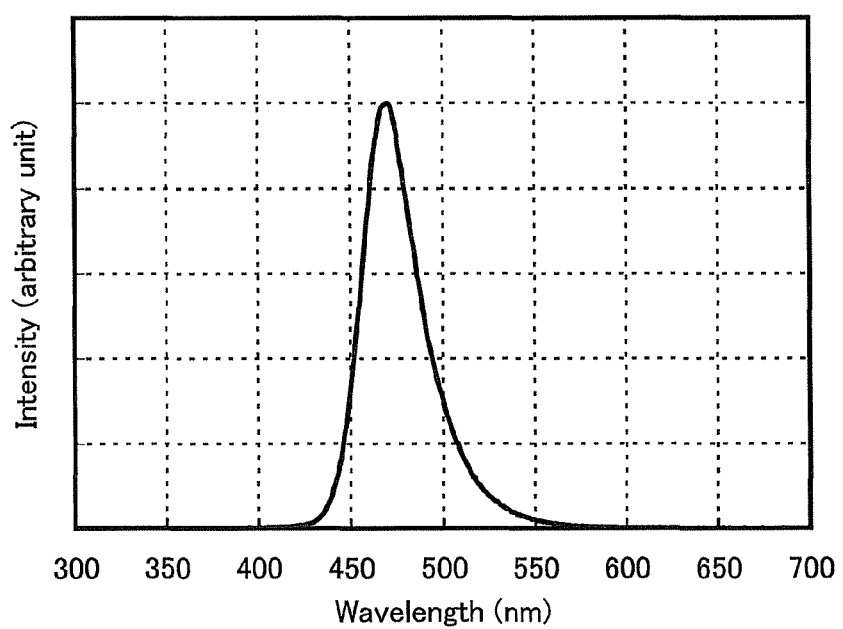
FIG. 12 shows an emission spectrum of a light-emitting element.

FIG. 12 shows an emission spectrum when a current of 1 mA flows to the light-emitting element. In FIG. 12, the vertical axis indicates the intensity (arbitrary unit) and the horizontal axis indicates the wavelength (nm). As shown in FIG. 12, the manufactured light-emitting element exhibited blue light emission derived from PCBAPA in the light-emitting layer. Note that CIF color coordinate of the light-emitting device at a voltage of 6.6 V was as follows: x is 0.1330, y is 0.1432.

Figure 13:
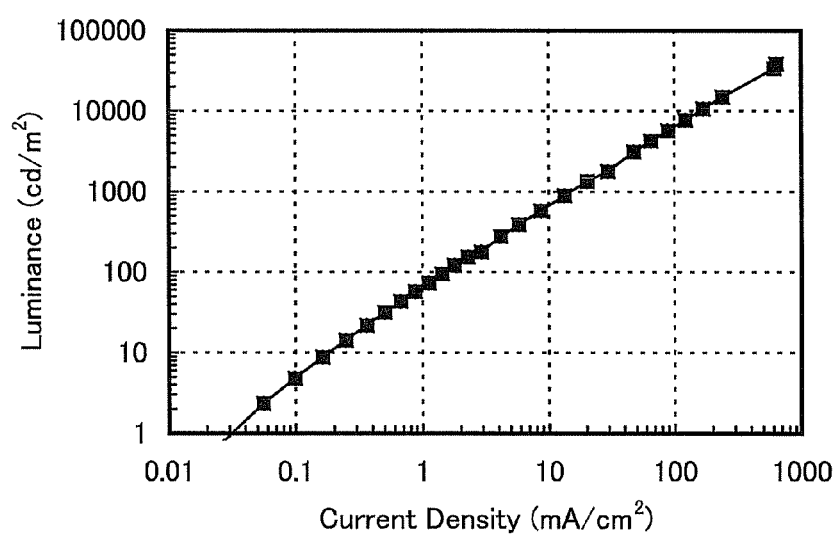
FIG. 13 is a graph showing current density-luminance characteristics of a light-emitting element.
Figure 14:
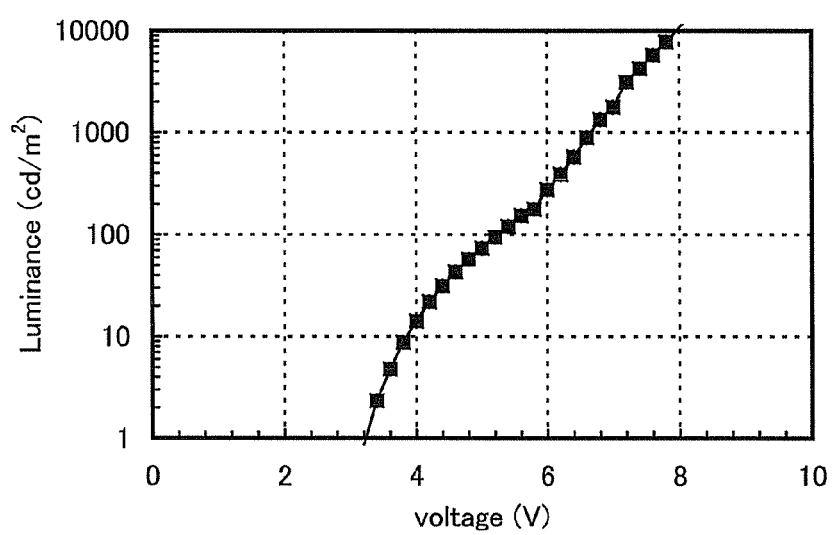
FIG. 14 is a graph showing voltage-luminance characteristics of a light-emitting element.
Figure 15:
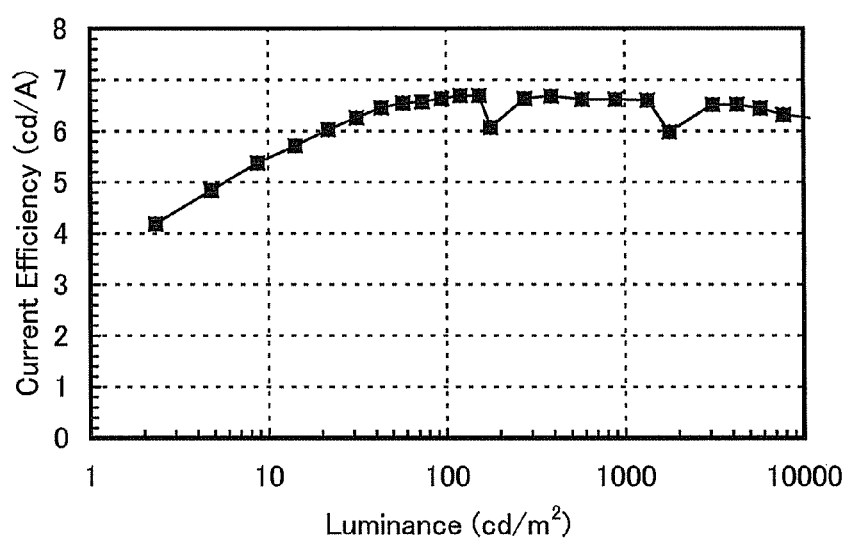
FIG. 15 is a graph showing luminance-current efficiency characteristic of a light-emitting element.
Figure 16:
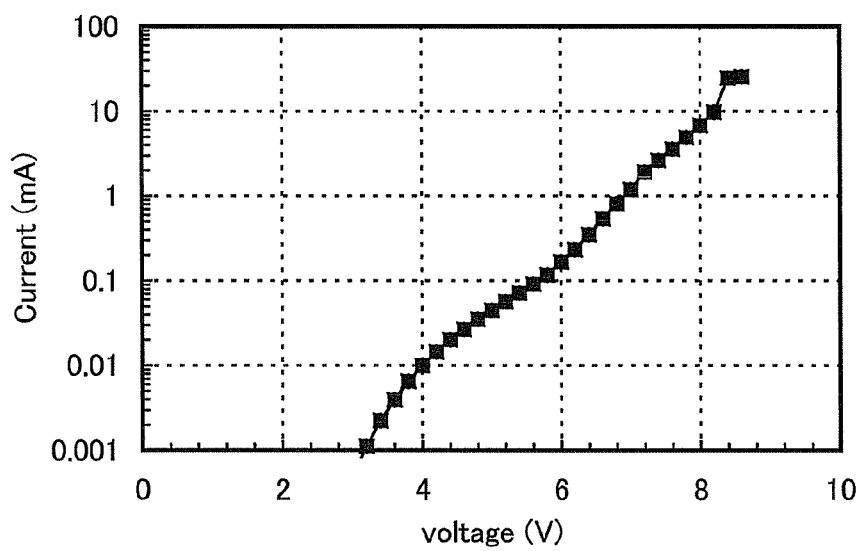
FIG. 16 is a graph showing voltage-current characteristics of a light-emitting element.

Current density-luminance characteristics, voltage-luminance characteristics, luminance-current efficiency characteristics, and voltage-current characteristics of the light-emitting element are shown in FIGS. 13, 14, 15 and 16, respectively. In FIG. 13, the vertical axis represents luminance ($cd/m^2$) and the horizontal axis represents current density ($mA/cm^2$). In FIG. 14, the vertical axis represents luminance ($cd/m^2$) and the horizontal axis represents voltage (V). In FIG. 15, the vertical axis represents current efficiency (cd/A) and the horizontal axis represents luminance ($cd/m^2$). In FIG. 16, the vertical axis represents current (mA) and the horizontal axis represents voltage (V). The current efficiency of the light-emitting element was 6.6 (cd/A) and the power efficiency was 3.1 (lm/W).

As described above, according to one embodiment of the present invention disclosed, it was confirmed that a light-emitting element having excellent characteristics could be manufactured.

This application is based on Japanese Patent Application serial no. 2009-252234 filed with Japan Patent Office on Nov. 2, 2009, the entire contents of which are hereby incorporated by reference.

What is claimed is:

1. A method for manufacturing a light-emitting element comprising:
    forming a first electrode including aluminum and nickel over a substrate;
    forming a layer including a composite material in which a metal oxide is contained in an organic compound so as to be in contact with the first electrode after heat treatment is performed with respect to the first electrode;
    forming a light-emitting layer over the layer including the composite material; and
    forming a second electrode which has a light-transmitting property over the light-emitting layer.

2. The method for manufacturing the light-emitting element, according to claim 1, wherein etching treatment is performed with respect to the first electrode, in addition to the heat treatment.

3. The method for manufacturing the light-emitting element, according to claim 1, wherein the first electrode is formed to include the nickel equal to or greater than 0.1 atomic % and equal to or less than 4.0 atomic %.

4. The method for manufacturing the light-emitting element, according to claim 1, wherein a light path length between the first electrode and the second electrode is an integral multiple of a wavelength of light emitted from the light-emitting layer so that an optically resonant structure is provided.

5. The method for manufacturing the light-emitting element, according to claim 1, wherein a layer including a substance having a high hole-injection property or a substance having a high hole-transport property is formed between the layer including the composite material and the light-emitting layer.

6. The method for manufacturing the light-emitting element, according to claim 1, wherein a layer including a substance having a high electron-injection property or a substance having a high electron-transport property is formed between the light-emitting layer and the second electrode.

7. A method for manufacturing a light-emitting element comprising:
forming a thin film transistor over a substrate;
forming a first electrode including aluminum and nickel so as to be electrically connected to the thin film transistor;
forming a layer including a composite material in which a metal oxide is contained in an organic compound so as to be in contact with the first electrode after heat treatment is performed with respect to the first electrode;
forming a light-emitting layer over the layer including the composite material; and
forming a second electrode which has a light-transmitting property over the light-emitting layer.

8. A method for manufacturing a light-emitting element comprising:
forming a first electrode including aluminum and nickel over a substrate;
forming a layer including a composite material in which a metal oxide is contained in an organic compound so as to be in contact with the first electrode after heat treatment is performed with respect to the first electrode;
forming a light-emitting layer over the layer including the composite material; and
forming a second electrode which has a light-transmitting property over the light-emitting layer;
wherein the substrate is selected from the group of a glass substrate, a plastic substrate, and a metal substrate.

* * * * *